(12) United States Patent
Yang

(10) Patent No.: US 8,762,814 B2
(45) Date of Patent: Jun. 24, 2014

(54) METHOD FOR ENHANCING ERROR CORRECTION CAPABILITY, AND ASSOCIATED MEMORY DEVICE AND CONTROLLER THEREOF

(75) Inventor: Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 222 days.

(21) Appl. No.: 13/162,561

(22) Filed: Jun. 16, 2011

(65) Prior Publication Data

US 2012/0124450 A1 May 17, 2012

(30) Foreign Application Priority Data

Nov. 15, 2010 (TW) ................................ 99139166 A

(51) Int. Cl.
*G11C 29/00* (2006.01)
*H03M 13/00* (2006.01)

(52) U.S. Cl.
USPC ............................ 714/764; 714/769; 714/793

(58) Field of Classification Search
USPC ......... 714/713, 758, 763, 764, 766, 769, 793, 714/799, 800
See application file for complete search history.

(56) References Cited

U.S. PATENT DOCUMENTS

| | | | |
|---|---|---|---|
| 2007/0089031 A1 | 4/2007 | Huffman | |
| 2008/0195900 A1* | 8/2008 | Chang et al. | 714/718 |
| 2008/0282106 A1 | 11/2008 | Shalvi | |
| 2009/0144598 A1* | 6/2009 | Yoon et al. | 714/752 |
| 2011/0022932 A1* | 1/2011 | Radke | 714/763 |
| 2011/0055659 A1* | 3/2011 | Tu et al. | 714/763 |
| 2011/0072333 A1* | 3/2011 | Kuo | 714/773 |
| 2011/0314354 A1* | 12/2011 | Fillingim | 714/760 |
| 2011/0320915 A1* | 12/2011 | Khan | 714/773 |
| 2012/0324311 A1* | 12/2012 | Flynn et al. | 714/758 |

OTHER PUBLICATIONS

Te-Hsuan Chen; Yu-Ying Hsiao; Yu-Tsao Hsing; Cheng-Wen Wu, "An Adaptive-Rate Error Correction Scheme for NAND Flash Memory," VLSI Test Symposium, 2009, VTS '09, 27th IEEE, vol., No., pp. 53,58, May 3-7, 2009.*
Taeho Kgil; Roberts, D.; Mudge, T., "Improving NAND Flash Based Disk Caches," Computer Architecture, 2008, ISCA '08, 35th International Symposium on , vol., No., pp. 327,328, Jun. 21-25, 2008.*

* cited by examiner

*Primary Examiner* — Cynthia Britt
(74) *Attorney, Agent, or Firm* — Winston Hsu; Scott Margo

(57) ABSTRACT

A method for enhancing error correction capability of a controller of a memory device without need to increase a basic error correction bit count of an Error Correction Code (ECC) engine includes: according to an error correction magnification factor, respectively obtaining a plurality of portions of data, where the portions are partial data to be encoded/decoded; and regarding the portions that are the partial data to be encoded/decoded, respectively performing encoding/decoding corresponding to the error correction magnification factor, in order to generate encoded/decoded data corresponding to a predetermined error correction bit count, where a ratio of the predetermined error correction bit count to the basic error correction bit count is equal to the error correction magnification factor. An associated memory device and the controller thereof are further provided.

18 Claims, 8 Drawing Sheets

| Partial data | Partial data | Partial data | Partial data | Parity code | Parity code | Parity code | Parity code |
|---|---|---|---|---|---|---|---|
| $D_4(1)$ | $D_4(2)$ | $D_4(3)$ | $D_4(4)$ | $P_4(1)$ | $P_4(2)$ | $P_4(3)$ | $P_4(4)$ |

METHOD FOR ENHANCING ERROR CORRECTION CAPABILITY, AND ASSOCIATED MEMORY DEVICE AND CONTROLLER THEREOF

BACKGROUND OF THE INVENTION

1. Field of the Invention

The present invention relates to error correction of a Flash memory control chip, and more particularly, to a method for enhancing error correction capability of a controller of a memory device without need to increase a basic error correction bit count of an Error Correction Code (ECC) engine, and to an associated memory device and a controller thereof.

2. Description of the Prior Art

As technologies of Flash memories progress in recent years, many kinds of portable memory devices (e.g. memory cards respectively complying with SD/MMC, CF, MS, and XD standards) or solid state drives (SSDs) equipped with Flash memories are widely implemented in various applications. Therefore, the control of access to Flash memories in these memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of at least two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. Although there are some solutions proposed by the related art in response to these problems, it seems unlikely that the related art gives consideration to both operation performance and system resource management. As a result, no matter which solution is chosen, a corresponding side effect typically exists.

More particularly, the error correction implemented according to the related art typically does not use up all the storage space of a Flash memory, where the remaining storage space of the Flash memory cannot be utilized for storing data, which is really wasteful. Please note that a typical reason why the related art does not use up all the storage space of the Flash memory is typically that, once the basic error correction bit count (which typically represents the error correction capability measured in bits with respect to a specific amount of data) of an Error Correction Code (ECC) engine is increased, the associated costs of the ECC engine are greatly increased. For example, with respect to 1K bytes (i.e. 1024 bytes) of data, increasing the ECC engine encoding/decoding bit count from 24 bits to 36 bits will cause the chip area of the ECC engine to greatly increase, where the new value of chip area may reach approximately 1.5 times the original value of the chip area. Therefore, a novel method is required for enhancing the control of data access of a Flash memory in a memory device, in order to give consideration to both operation performance and system resource management.

SUMMARY OF THE INVENTION

It is therefore an objective of the claimed invention to provide a method for enhancing error correction capability, and to provide an associated memory device and a controller thereof, in order to solve the above-mentioned problems.

It is another objective of the claimed invention to provide a method for enhancing error correction capability, and to provide an associated memory device and a controller thereof, in order to properly utilize the remaining storage space mentioned above.

According to a preferred embodiment of the claimed invention, a method for enhancing error correction capability is provided. The method is applied to a controller of a Flash memory, and the method is utilized for enhancing the error correction capability of the controller without need to increase a basic error correction bit count. The method comprises: according to an error correction magnification factor, respectively obtaining a plurality of portions of data, wherein the portions are partial data to be encoded/decoded; and regarding the portions that are the partial data to be encoded/decoded, respectively performing encoding/decoding corresponding to the error correction magnification factor, in order to generate encoded/decoded data corresponding to a predetermined error correction bit count, wherein a ratio of the predetermined error correction bit count to the basic error correction bit count is equal to the error correction magnification factor.

While the method mentioned above is disclosed, an associated memory device is further provided, wherein error correction capability of the memory device is enhanced without need to increase a basic error correction bit count. The memory device comprises: a Flash memory, wherein the Flash memory comprises a plurality of blocks; and a controller arranged to access the Flash memory and manage the plurality of blocks. An Error Correction Code (ECC) engine of the controller is implemented by utilizing a microprocessor and/or a control logic within the controller, and according to an error correction magnification factor, the controller respectively obtains a plurality of portions of data, wherein the portions are partial data to be encoded/decoded. In addition, regarding the portions that are the partial data to be encoded/decoded, the ECC engine respectively performs encoding/decoding corresponding to the error correction magnification factor, in order to generate encoded/decoded data corresponding to a predetermined error correction bit count, wherein a ratio of the predetermined error correction bit count to the basic error correction bit count is equal to the error correction magnification factor.

While the method mentioned above is disclosed, a controller of a memory device is further provided, wherein error correction capability of the controller is enhanced without need to increase a basic error correction bit count. The controller is utilized for accessing a Flash memory of the memory device, and the Flash memory comprises a plurality of blocks. The controller comprises: a read only memory (ROM) arranged to store a program code; and a microprocessor arranged to execute the program code to control the access to the Flash memory and manage the plurality of blocks. An ECC engine of the controller is implemented by utilizing a control logic within the controller and/or the microprocessor executing the program code, and according to an error correction magnification factor, the controller respectively obtains a plurality of portions of data, wherein the portions are partial data to be encoded/decoded. In addition, regarding the portions that are the partial data to be encoded/decoded, the ECC engine respectively performs encoding/decoding corresponding to the error correction magnification factor, in order to generate encoded/decoded data corresponding to a predetermined error correction bit count, wherein a ratio of the predetermined error correction bit count to the basic error correction bit count is equal to the error correction magnification factor.

According to a preferred embodiment of the claimed invention, a method for enhancing error correction capability is provided, wherein the method is applied to a controller of a Flash memory. The method comprises: dividing a set of data into a plurality of sets of partial data; and utilizing an ECC engine to perform encoding on the sets of partial data, in order to generate a plurality of parity codes corresponding to the sets of partial data; wherein a length of the set of data is determined according to a minimum error correction unit of the memory device. In particular, at least two sets of the sets of partial data overlap each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3A-3C illustrate some implementation details of the method shown in FIG. 2 according to different embodiments of the present invention.

FIG. 4 illustrates some implementation details of the method shown in FIG. 2 according to an embodiment of the present invention.

FIG. 5 illustrates some implementation details of the method shown in FIG. 2 according to another embodiment of the present invention.

DETAILED DESCRIPTION

Figure 1A:
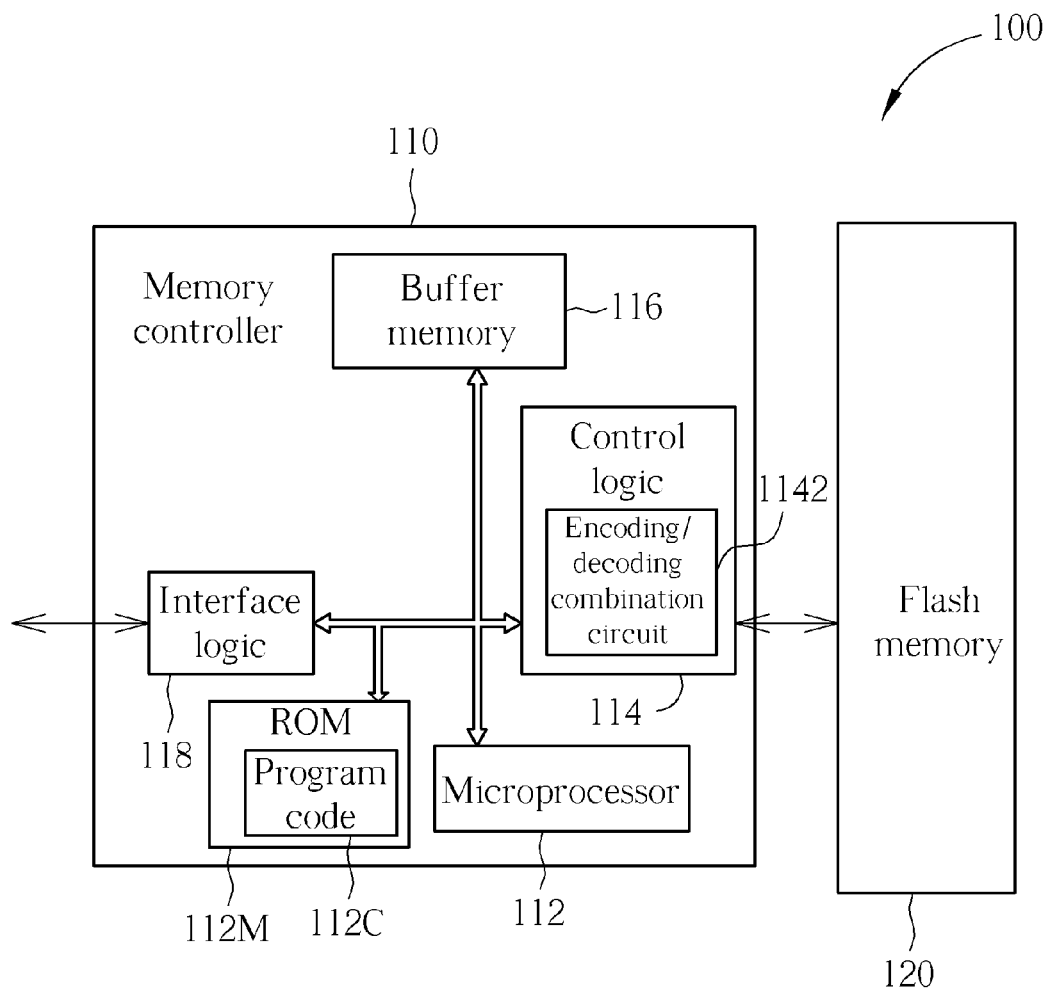
FIG. 1A is a diagram of a memory device according to a first embodiment of the present invention.

Please refer to FIG. 1A, which illustrates a diagram of a memory device 100 according to a first embodiment of the present invention. In particular, the memory device 100 of this embodiment can be a portable memory device, examples of which may include, but not limited to, memory cards complying with SD/MMC, CF, MS, or XD standards. Here, the portable memory device is taken as an example of the memory device 100 in this embodiment. This is for illustrative purposes only, and is not meant to be a limitation of the present invention. According to a variation of this embodiment, the memory device 100 can be a solid state drive (SSD). Referring to FIG. 1A, the memory device 100 comprises a Flash memory 120, and further comprises a controller arranged to access the Flash memory 120, where the aforementioned controller of this embodiment is a memory controller 110, and the error correction capability of the memory device 100 (and more particularly, the controller therein, such as the memory controller 110) can be enhanced without need to increase a basic error correction bit count of an Error Correction Code (ECC) engine of the controller. According to this embodiment, the memory controller 110 comprises a microprocessor 112, a read only memory (ROM) 112M, a control logic 114, at least one buffer memory 116, and an interface logic 118. The ROM 112M is arranged to store a program code 112C, and the microprocessor 112 is arranged to execute the program code 112C to control the access to the Flash memory 120. Please note that the program code 112C can be stored in the buffer memory 116 or any of various kinds of memories according to variations of this embodiment. In addition, the control logic 114 of this embodiment comprises at least one encoding/decoding combination circuit 1142.

Typically, the Flash memory 120 comprises a plurality of blocks, and when the controller (e.g. the memory controller 110 that executes the program code 112C by utilizing the microprocessor 112) performs data erasure operations on the Flash memory 120, the minimum erasure unit can be a block. In addition, a block can be utilized for recording a specific amount of pages, and when the controller performs data programming/writing operations on the Flash memory 120, the minimum programming/writing unit can be a page.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to each Flash memory chip (e.g. operations of accessing at least one block or at least one page), utilizes the buffer memory 116 to perform buffering operations for the memory controller 110, and utilizes the interface logic 118 to communicate with a host device.

According to this embodiment, the memory device 100 is a memory device whose error correction capability can be enhanced without need to increase a basic error correction bit count of the ECC engine. In practice, the aforementioned ECC engine can be implemented by utilizing the encoding/decoding combination circuit 1142 within the control logic 114. This is for illustrative purposes only, and is not meant to be a limitation of the present invention. According to different variations of this embodiment, the aforementioned ECC engine can be implemented by utilizing the control logic 114 and/or the microprocessor 112 executing the program code 112C. For example, the ECC engine is a portion of the control logic 114, and is formed with the logic circuits within the control logic 114. In another example, the program code 112C comprises some program modules/units, and the ECC engine is implemented by utilizing the microprocessor 112 executing the program modules/units. In another example, the ECC engine is implemented by utilizing the control logic 114 and by utilizing the microprocessor 112 executing the program code 112C, where the program code 112C comprises some program modules/units, and a portion of the ECC engine is implemented by utilizing the microprocessor 112 executing the program modules/units, while another portion of the ECC engine is formed with the logic circuits within the control logic 114.

In this embodiment, according to an error correction magnification factor, the aforementioned controller can respectively obtain a plurality of portions of data $D_M$, where the portions are partial data to be encoded/decoded, and the suffix M can be a positive integer. In general, the data $D_M$ may represent original data, or represent a set formed with the portions that are the partial data to be encoded/decoded. For example, in a situation where M is equal to one (i.e. M=1), the data $D_M$ is the original data $D_1(1)$. In another example, in a situation where M is greater than one (i.e. M>1), the data $D_M$ is the set formed with the partial data $\{D_M(m)\}$, where the index m may represent a positive integer falling within the range of the interval [1, M]. Thus, in a situation where M is greater than one (i.e. M>1), according to the error correction magnification factor, the aforementioned controller can respectively obtain M portions of data $D_M$, where the M portions are the partial data $\{D_M(m)\}$ to be encoded/decoded, such as the partial data $D_M(1)$, $D_M(2)$, ..., and $D_M(M)$, i.e. the M portions comprise the partial data $D_M(1)$, $D_M(2)$, ..., and $D_M(M)$. In addition, regarding the M portions that are the partial data $\{D_M(m)\}$ to be encoded/decoded, such as the partial data $D_M(1)$, $D_M(2)$, ..., and $D_M(M)$, the aforementioned ECC engine respectively performs encoding/decoding corresponding to the error correction magnification factor, in order to generate encoded/decoded data corresponding to a predetermined error correction bit count, where the ratio of the predetermined error correction bit count to the basic error correction bit count is equal to the error correction magnification factor.

Figure 1B:
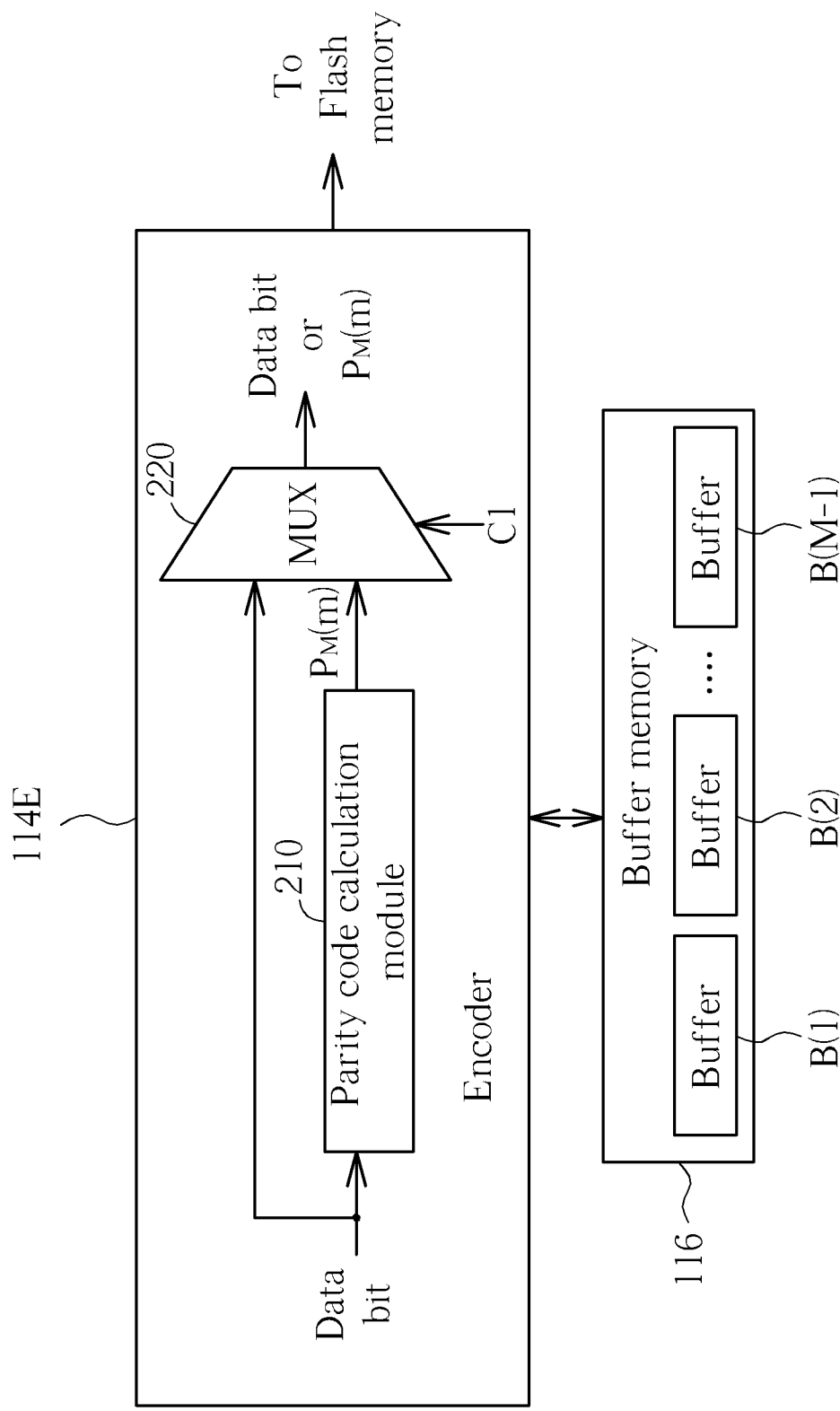
FIG. 1B is a diagram of an encoder and a plurality of buffers that can be accessed by the encoder according to an embodiment of the present invention.

FIG. 1B is a diagram of an encoder 114E and a plurality of buffers B(1), B(2), ..., and B(M−1) that can be accessed by the encoder 114E according to an embodiment of the present invention, where the encoder 114E is a portion of the aforementioned ECC engine. For example, the buffers B(1), B(2), ..., and B(M−1) can be a plurality of buffering regions within the buffer memory 116. In another example, the aforementioned at least one buffer memory 116 comprises a plurality of buffer memories, which can be utilized for implementing the buffers B(1), B(2), ..., and B(M−1).

As shown in FIG. 1B, the encoder 114E comprises at least one parity code calculation module 210 and a multiplexing unit 220 (labeled "MUX" in FIG. 1B). Here, the number M of the portions such as the partial data $D_M(1)$, $D_M(2)$, ..., and $D_M(M)$ is equal to the error correction magnification factor. In a situation where encoding is performed by the controller, the aforementioned encoded/decoded data is encoded data, and regarding the portions, the parity code calculation module 210 respectively generates (or calculates) M parity codes $P_M(1)$, $P_M(2)$, ..., and $P_M(M)$, and the multiplexing unit 220 multiplexes data bits or the parity code $P_M(m)$ according to the control signal C1 of the aforementioned ECC engine, for further use. Thus, the number M of the parity codes $P_M(1)$, $P_M(2)$, ..., and $P_M(M)$ is equal to the number of the portions such as the partial data $D_M(1)$, $D_M(2)$, ..., and $D_M(M)$, and the encoded data comprises the portions such as the partial data $D_M(1)$, $D_M(2)$, ..., and $D_M(M)$ and the parity codes $P_M(1)$, $P_M(2)$, ..., and $P_M(M)$. According to this embodiment, the bit count of each parity code can be equal to the aforementioned basic error correction bit count.

In practice, by utilizing the buffers B(1), B(2), ..., and B(M−1), the encoder 114E can temporarily store the parity codes $P_M(1)$, $P_M(2)$, ..., and $P_M(M-1)$ corresponding to the first (M−1) portions such as the partial data $D_M(1)$, $D_M(2)$, ..., and $D_M(M-1)$. In addition, the encoder 114E can write/program the data $D_M$ (which comprises the partial data $D_M(1)$, $D_M(2)$, ..., and $D_M(M)$) into the Flash memory 120, and when the parity code $P_M(M)$ corresponding to the $M^{th}$ portion such as the partial data $D_M(M)$ is generated, the encoder 114E can append all of the parity codes $P_M(1)$, $P_M(2)$, ..., and $P_M(M)$ to the end of the data $D_M$ in order, making both the data $D_M$ and the parity codes $P_M(1)$, $P_M(2)$, ..., and $P_M(M)$ be written/programmed into the Flash memory 120.

Please note that, according to the definition of shortening of the modified linear code within related principles of the linear block code, an (n, k) code can become an (n−1, k−1) code, where with regard to the (n, k) code, k is the original length of the data $D_M$ before encoding, and n is the length of the codeword generated after performing encoding (such as Bose, Ray-Chaudhuri, Hocquenghem (BCH) encoding, for example) on the data $D_M$, i.e. the total length of both the data $D_M$ and the parity code $P_M$, where $P_M$ is a general notation of at least one parity code such as the parity code $P_1(1)$ or the parity codes $\{P_M(m)\}$. In addition, based upon extension of this definition, an (n, k) code can become an (n-s, k-s) code. Please note that, regarding the (n, k) code and the (n-s, k-s) code, the respective total length of the respective parity code $P_M$ of the two sets of associated codeword are equal to each other (and are equal to (n-k), respectively), which means the error control ability (e.g. the error correction bit count) of the two sets of codeword are equivalent to each other. For example, when a set of data having 1024 bytes is encoded according to a specific encoding method and therefore the associated codeword having 1066 bytes is generated, within the codeword, the length of the data is equal to 1024 bytes and the length of the parity code is equal to 42 bytes, where the parity code having 42 bytes provides the data having 1024 bytes with the error correction capability of 24 bits. In addition, when another set of data having 512 bytes is encoded according to the aforementioned specific encoding method and therefore the associated codeword having 554 bytes is generated, within the codeword, the length of the data is equal to 512 bytes and the length of the parity code is equal to 42 bytes, where the parity code having 42 bytes provides the data having 512 bytes with the error correction capability of 24 bits. Therefore, by dividing a set of data having 1024 bytes into two sets of data, each set of which has 512 bytes, and by encoding the two sets of data with the same encoding method being applied, two sets of codeword respectively having the error correction capability of 24 bits can be obtained. In contrast to this, by encoding the set of data having 1024 bytes with the same encoding method being applied, only a set of codeword having the error correction capability of 24 bits can be obtained. Thus, by dividing data into two sets first and then encoding the two sets of data, twice the original error correction capability (i.e. the error correction capability of encoding without dividing data) can be achieved. In general, by dividing data into multiple sets first and then encoding these sets of data, multiplied error correction capability can be achieved.

Figure 1C:
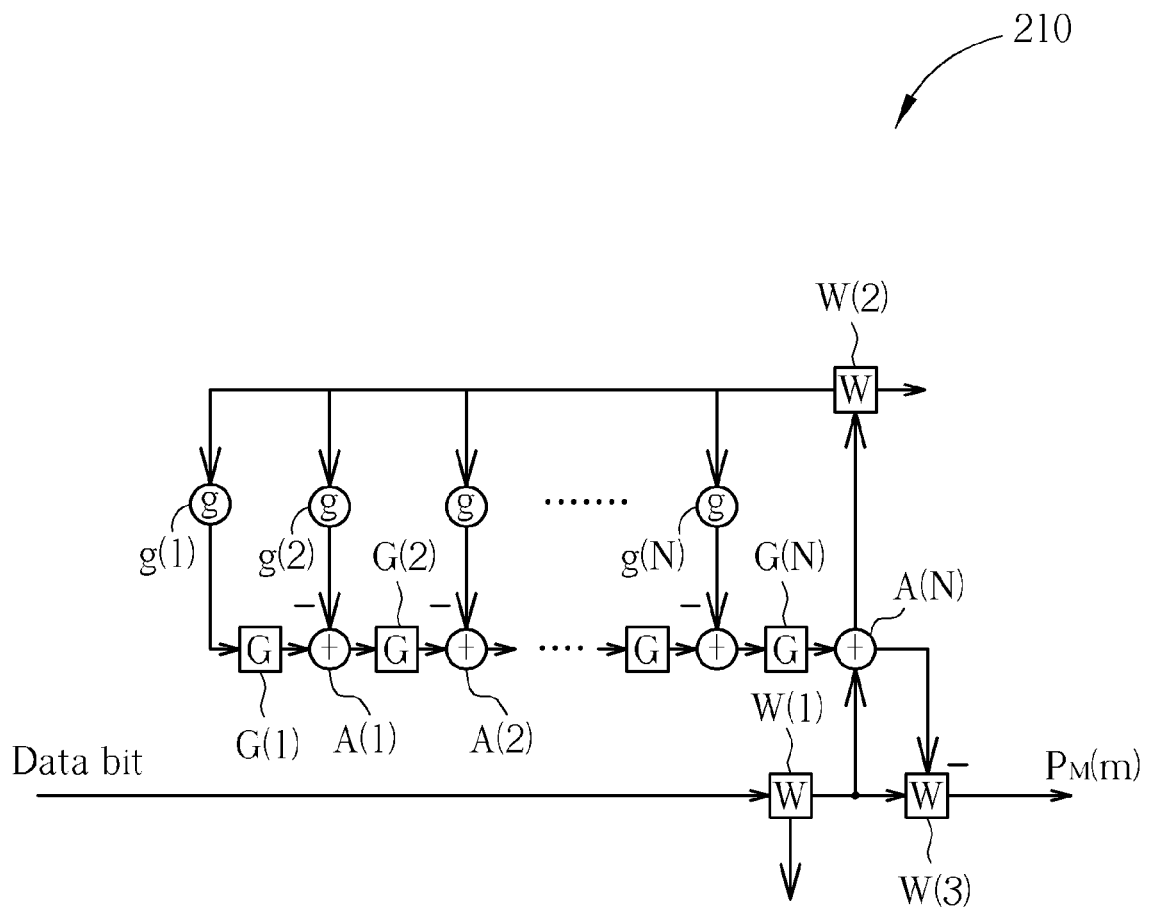
FIG. 1C illustrates some implementation details of the parity code calculation module shown in FIG. 1B according to an embodiment of the present invention.

FIG. 1C illustrates some implementation details of the parity code calculation module 210 shown in FIG. 1B according to an embodiment of the present invention. Here, the parity code calculation module 210 includes: at least N registers G(1), G(2), ..., and G(N) (labeled "G" in FIG. 1C) arranged to temporarily store information, respectively; at least N adjustment units g(1), g(2), ..., and g(N) (labeled "g" in FIG. 1C) arranged to adjust the information on the paths thereof (i.e. the respective paths where the adjustment units g(1), g(2), ..., and g(N) are positioned) according to their own input parameters, respectively; at least N arithmetic units A(1), A(2), ..., and A(N) (labeled "+" in FIG. 1C) arranged to perform subtraction or addition operations, respectively; and at least three switching units W(1), W(2), and W(3) (labeled "W" in FIG. 1C) arranged to switch calculation paths or input/output paths. Within the components shown in FIG.

1C, for those whose input terminals are labeled with the notation "−" (e.g. the arithmetic units A(1) and A(2) and the switching unit W(3)), the notation "−" represents that the positive or negative signs of the inputs sent into these input terminals should be changed.

Figure 1D:
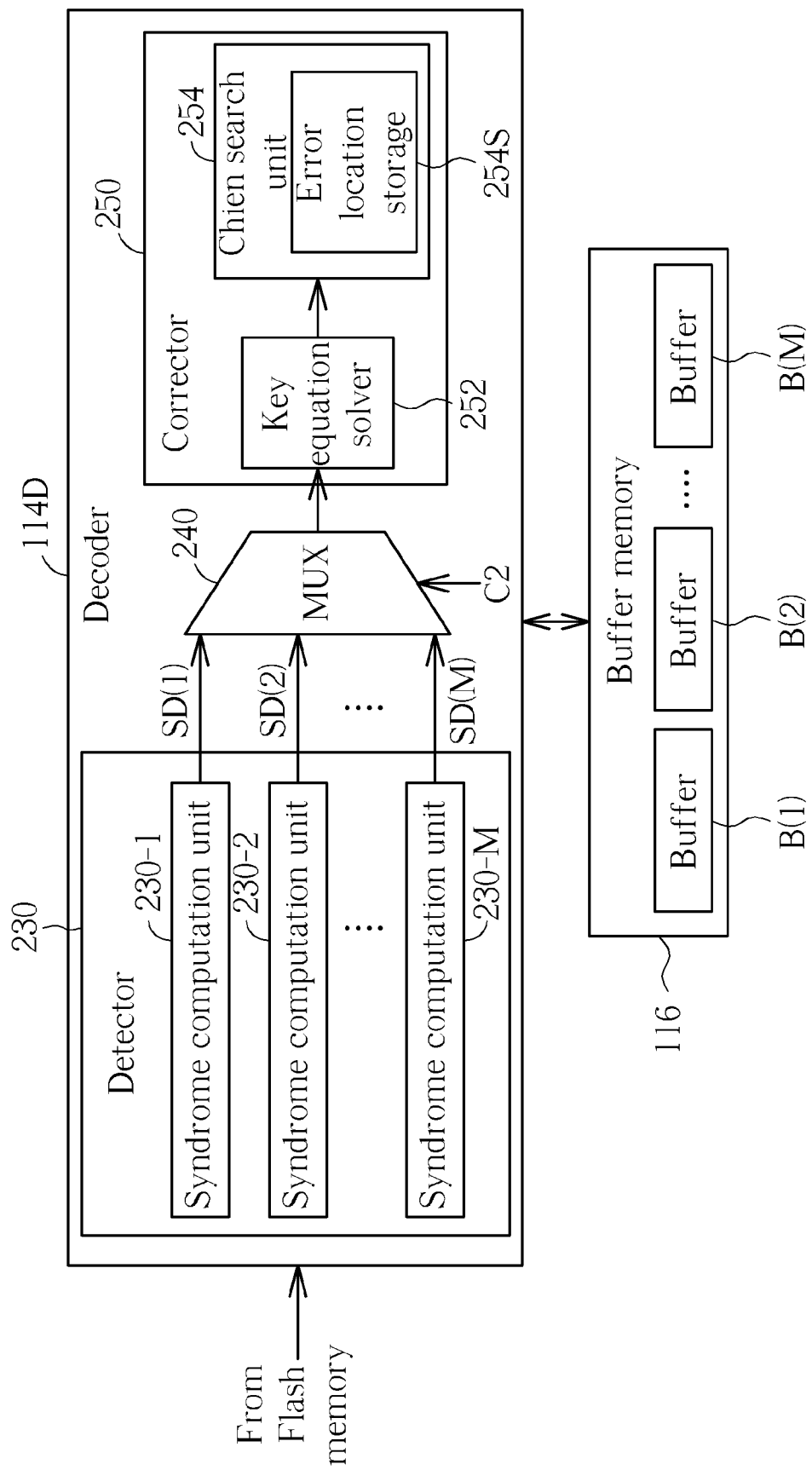
FIG. 1D is a diagram of a decoder and a plurality of buffers that can be accessed by the decoder according to an embodiment of the present invention.

FIG. 1D is a diagram of a decoder 114D and a plurality of buffers B(1), B(2), . . . , and B(M) that can be accessed by the decoder 114D according to an embodiment of the present invention, where the decoder 114D is a portion of the aforementioned ECC engine. For example, the buffers B(1), B(2), . . . , and B(M) can be a plurality of buffering regions within the buffer memory 116. In another example, the aforementioned at least one buffer memory 116 comprises a plurality of buffer memories, which can be utilized for implementing the buffers B(1), B(2), . . . , and B(M).

As shown in FIG. 1D, the decoder 114D comprises a detector 230, a multiplexing unit 240 (labeled "MUX" in FIG. 1D), and a corrector 250, where the detector 230 comprises M syndrome computation units 230-1, 230-2, . . . , and 230-M, and the corrector 250 comprises a key equation solver 252 and a Chien search unit 254, with an error location storage 254S being installed within the Chien search unit 254. In a situation where decoding is performed by the controller, the aforementioned encoded/decoded data is decoded data. The M portions of data $D_M$ that the decoder 114D reads from the Flash memory 120, such as the partial data $D_M(1)$, $D_M(2)$, . . . , and $D_M(M)$, can be temporarily stored in the buffers B(1), B(2), . . . , and B(M), respectively, for use of performing error correction when needed. Regarding the portions in the buffers B(1), B(2), . . . , and B(M), such as the partial data $D_M(1)$, $D_M(2)$, . . . , and $D_M(M)$, the syndrome computation units 230-1, 230-2, . . . , 230-M can respectively perform syndrome computation operations of error correction according to a plurality of parity codes corresponding to the portions, such as the aforementioned M parity codes $P_M(1)$, $P_M(2)$, . . . , and $P_M(M)$, and the multiplexing unit 240 can multiplex any of the computation results SD(1), SD(2), . . . , and SD(M) of the syndrome computation operations according to the control signal C2 of the aforementioned ECC engine, for further use. In addition, regarding the portions, the corrector 250 respectively performs error correction according to the computation results of the syndrome computation operations. More particularly, the key equation solver 252 can solve the key equation according to the computation results SD(1), SD(2), . . . , and SD(M), and the Chien search unit 254 can perform Chien search to find out error location(s) of the data $D_M$ (if any error exists), and store the error location(s) into the error location storage 254S. As a result, according to the error location(s) stored in the error location storage 254S, the corrector 250 can perform error correction on the portions in the buffers B(1), B(2), . . . , and B(M), such as the partial data $D_M(1)$, $D_M(2)$, . . . , and $D_M(M)$.

According to a variation of this embodiment, the detector 230 can be implemented by utilizing at least one portion of the encoder 114E. For example, regarding the portions in the buffers B(1), B(2), . . . , and B(M), such as the partial data $D_M(1)$, $D_M(2)$, . . . , and $D_M(M)$, the controller can utilize the encoder 114E to perform associated calculations such as parity code calculations, in order to verify (or determine) whether any error exists within the M parity codes $P_M(1)$, $P_M(2)$, . . . , and $P_M(M)$ corresponding to the portions and/or find out the error location(s) of the data $D_M$ (if any error exists). As a result, according to the error location(s) found in this variation, the corrector 250 can perform error correction on the portions in the buffers B(1), B(2), . . . , and B(M), such as the partial data $D_M(1)$, $D_M(2)$, . . . , and $D_M(M)$. Similar descriptions for this variation are not repeated in detail here.

Please note that, as the error location(s) in the data $D_M$ is random, the parity codes $P_M(1)$, $P_M(2)$, . . . , and $P_M(M)$ can be utilized when needed, and the error correction capability of utilizing the parity codes $P_M(1)$, $P_M(2)$, . . . , and $P_M(M)$ can typically reach M times the error correction capability of utilizing any of the parity codes $P_M(1)$, $P_M(2)$, . . . , and $P_M(M)$. For example, if the basic error correction bit count with respect to 1024 bytes of data (which can be referred to as 1K bytes of data hereinafter, for simplicity) is equal to 24 bits, in a situation where M is equal to one (i.e. M=1), only one parity code $P_1(1)$ is generated regarding the data $D_M$ such as the original data $D_1(1)$, the error correction capability of utilizing the parity code $P_1(1)$ may reach 24 bits per 1K bytes of data. In a situation where M is greater than one (i.e. M>1), the data $D_M$ is divided into a plurality of portions, and M parity codes $P_M(1)$, $P_M(2)$, . . . , and $P_M(M)$ are generated regarding the partial data $D_M(1)$, $D_M(2)$, . . . , and $D_M(M)$, where the respective parity codes $P_M(1)$, $P_M(2)$, . . . , and $P_M(M)$ provide the respective partial data $D_M(1)$, $D_M(2)$, . . . , and $D_M(M)$ with the error correction capability of 24 bits, respectively. In general, when the controller utilizes the parity codes $P_M(1)$, $P_M(2)$, . . . , and $P_M(M)$ to perform protection on the data $D_M$, the error correction capability thereof may reach (24*M) bits per 1K bytes of data. Therefore, the present invention can enhance the error correction capability of the controller, having no need to increase the hardware complexity of the parity code calculation module 210. Thus, the related art problem that the chip area of the ECC engine greatly increases can be prevented.

Figure 2:
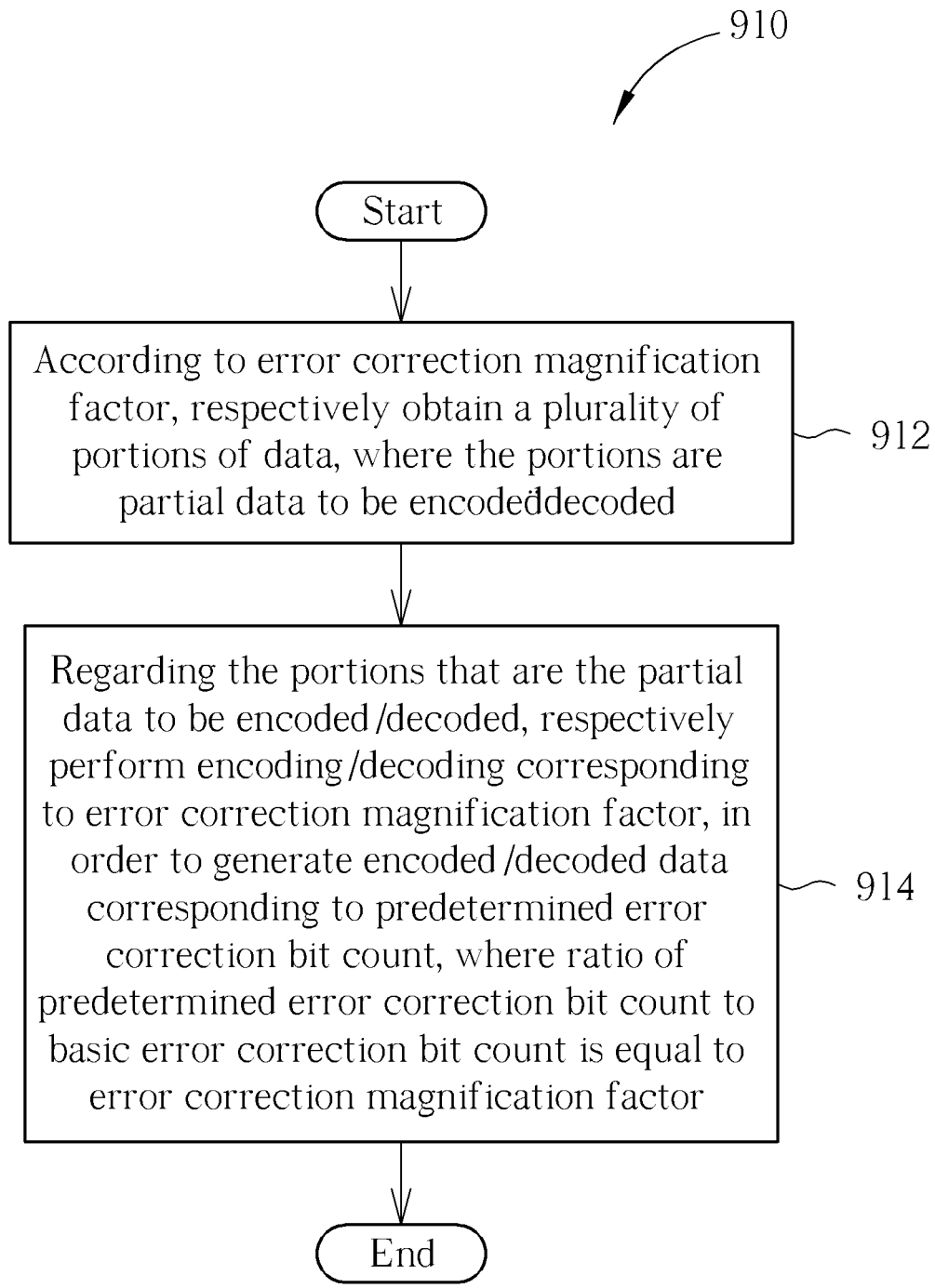
FIG. 2 is a flowchart of a method for enhancing error correction capability according to an embodiment of the present invention.

FIG. 2 is a flowchart of a method 910 for enhancing error correction capability according to an embodiment of the present invention. The method can be applied to the memory device 100 in any of the respective embodiments shown in FIGS. 1A-1D and associated variations, and more particularly, the aforementioned controller (e.g. the memory controller 110 that executes the program code 112C by utilizing the microprocessor 112), where the method can enhance the error correction capability of the controller without need to increase a basic error correction bit count. In addition, the method can be implemented by utilizing the memory device 100 in any of the respective embodiments shown in FIGS. 1A-1D and associated variations, and more particularly, by utilizing the aforementioned controller. The method is described as follows.

In Step 912, according to the error correction magnification factor, the aforementioned controller respectively obtains a plurality of portions of the data $D_M$, and more particularly, the portions that are partial data to be encoded/decoded, such as the aforementioned M portions of data $D_M$, where the M portions are the partial data $\{D_M(m)\}$ to be encoded/decoded, such as the partial data $D_M(1)$, $D_M(2)$, . . . , and $D_M(M)$. More particularly, the number M of the portions is equal to the error correction magnification factor. In addition, the data amounts of any two of the portions such as the partial data $D_M(1)$, $D_M(2)$, . . . , and $D_M(M)$ are equal to each other, and any two of the portions do not overlap each other. This is for illustrative purposes only, and is not meant to be a limitation of the present invention. According to some variations of this embodiment, it is unnecessary that the data amounts of all of the portions such as the partial data $D_M(1)$, $D_M(2)$, . . . , and $D_M(M)$ are equal to each other. According to some variations of this embodiment, at least two of the portions may overlap each other. Please note that the length of the data $D_M$ can be determined according to the minimum error correction protection unit (which can also be referred to as the minimum error correction unit, for simplicity) of the Flash memory 120. For example, some regulations of a certain vendor/Flash memory manufacturer may indicate that the minimum error correction protection unit of the Flash memories of a certain model provided by this vendor/Flash memory manufacturer is 1024 bytes, and may further indicate that the memory controller should provide the minimum error correction protection unit with error correction protection of 24 bits. In this situation, the length of the data $D_M$ can be determined as 1024 bytes.

In Step 914, regarding the M portions that are the partial data $\{D_M(m)\}$ to be encoded/decoded, such as the partial data $D_M(1)$, $D_M(2)$, . . . , and $D_M(M)$, the aforementioned ECC engine respectively performs encoding/decoding corresponding to the error correction magnification factor (e.g. the error correction magnification factor M), in order to generate the encoded/decoded data corresponding to the aforementioned predetermined error correction bit count such as the predetermined error correction bit count $ECB_P$. More particularly, the ratio of the predetermined error correction bit count $ECB_P$ to the aforementioned basic error correction bit count such as the basic error correction bit count $ECB_B$ is equal to the error correction magnification factor M, and this relationship can be expressed as follows:

$$ECB_P/ECB_B=M.$$

For example, possible values of the basic error correction bit count $ECB_B$ of the aforementioned ECC engine comprise the set {24, 28, 36, 40, 48, 60}, which means in different real modes $M_{RE}(24)$, $M_{RE}(28)$, $M_{RE}(36)$, $M_{RE}(40)$, $M_{RE}(48)$, or $M_{RE}(60)$, the basic error correction bit count with respect to 1K bytes of data can be 24 bit, 28 bit, 36 bit, 40 bit, 48 bit, or 60 bit, respectively.

According to this embodiment, possible values of the predetermined error correction bit count $ECB_P$ may comprise the set {(24*M), (28*M), (36*M), (40*M), (48*M), (60*M)}, which means in different pseudo modes $M_{PS}(24, M)$, $M_{PS}(28, M)$, $M_{PS}(36, M)$, $M_{PS}(40, M)$, $M_{PS}(48, M)$, or $M_{PS}(60, M)$ respectively corresponding to the error correction magnification factor M, the predetermined error correction bit count with respect to 1K bytes of data can be (24*M) bits, (28*M) bits, (36*M) bits, (40*M) bits, (48*M) bits, or (60*M) bits, respectively. More particularly, the error correction magnification factor M of this embodiment is adjustable. For example, in a situation where M=2, possible values of the predetermined error correction bit count $ECB_P$ may comprise the set {48, 56, 72, 80, 96, 120}, which means in different pseudo modes $M_{PS}(24, 2)$, $M_{PS}(28, 2)$, $M_{PS}(36, 2)$, $M_{PS}(40, 2)$, $M_{PS}(48, 2)$, or $M_{PS}(60, 2)$, the predetermined error correction bit count with respect to 1K bytes of data can be 48 bits, 56 bits, 72 bits, 80 bits, 96 bits, or 120 bits, respectively. In another example, in a situation where M=4, possible values of the predetermined error correction bit count $ECB_P$ may comprise the set {96, 112, 144, 160, 192, 240}, which means in different pseudo modes $M_{PS}(24, 4)$, $M_{PS}(28, 4)$, $M_{PS}(36, 4)$, $M_{PS}(40, 4)$, $M_{PS}(48, 4)$, or $M_{PS}(60, 4)$, the predetermined error correction bit count with respect to 1K bytes of data can be 96 bits, 112 bits, 144 bits, 160 bits, 192 bits, or 240 bits, respectively.

Thus, by utilizing the method shown in FIG. 2, the memory device 100 in any of the respective embodiments shown in FIGS. 1A-1D and associated variations (and more particularly, the aforementioned controller and the ECC engine therein) can support a plurality of sets of pseudo modes $M_{PS}$ (24, M), $M_{PS}(28, M)$, $M_{PS}(36, M)$, $M_{PS}(40, M)$, $M_{PS}(48, M)$, and $M_{PS}(60, M)$, such as a first set of pseudo modes $M_{PS}(24, 2)$, $M_{PS}(28, 2)$, $M_{PS}(36, 2)$, $M_{PS}(40, 2)$, $M_{PS}(48, 2)$, and $M_{PS}(60, 2)$ and a second set of pseudo modes $M_{PS}(24, 4)$, $M_{PS}(28, 4)$, $M_{PS}(36, 4)$, $M_{PS}(40, 4)$, $M_{PS}(48, 4)$, or $M_{PS}(60, 4)$ within this embodiment. In addition, by utilizing the respective sets of pseudo modes provided by the memory controller 110, the present invention can properly utilize the remaining storage space mentioned above, and even can use up the remaining storage space mentioned above.

Figure 3A:
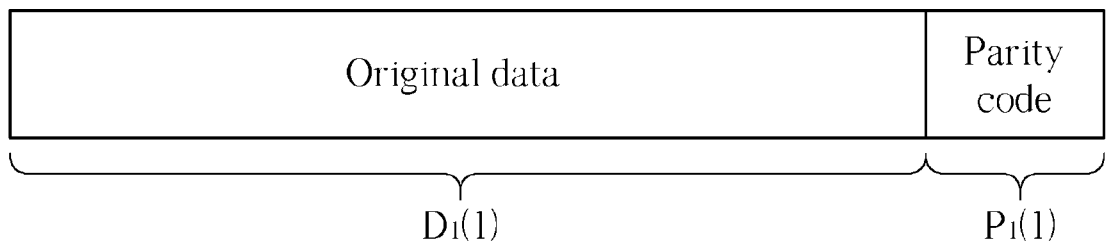
Figure 3B:
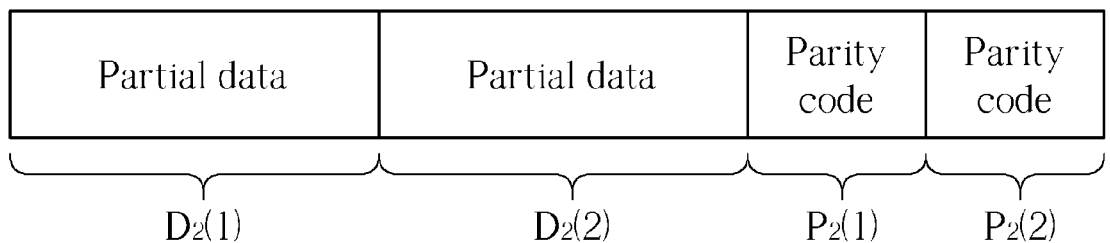

FIGS. 3A-3C illustrate some implementation details of the method 910 shown in FIG. 2 according to different embodiments of the present invention. FIG. 3A illustrates the writing/programming order of the original data $D_1(1)$ corresponding to a real mode (e.g. any of the real modes $M_{RE}(24)$, $M_{RE}(28)$, $M_{RE}(36)$, $M_{RE}(40)$, $M_{RE}(48)$, and $M_{RE}(60)$) and the associated parity code $P_1(1)$. In addition, FIG. 3B illustrates the writing/programming order of the partial data $D_2(1)$ and $D_2(2)$ corresponding to a pseudo mode (e.g. any of the pseudo modes $M_{PS}(24, 2)$, $M_{PS}(28, 2)$, $M_{PS}(36, 2)$, $M_{PS}(40, 2)$, $M_{PS}(48, 2)$, and $M_{PS}(60, 2)$) and the associated parity code $P_2(1)$ and $P_2(2)$. Please refer to FIG. 1B, FIG. 1C, and FIG. 3A. When the memory controller 110 is going to generate the partial data $D_2(1)$ and $D_2(2)$ and the associated parity codes $P_2(1)$ and $P_2(2)$ shown in FIG. 1B, the microprocessor 112 inputs the original data $D_1(1)$ stored in the buffer memory 116 into the encoder 114E within the ECC engine. Based upon the instruction of the microprocessor 112, the encoder 114E first utilize the control signal C1 to switch the multiplexing unit 220, causing the partial data $D_2(1)$ to be input into the Flash memory 120. At this moment, the partial data $D_2(1)$ is input into the parity code calculation module 210 in order, and when the whole of the partial data $D_2(1)$ has been input into the parity code calculation module 210, the microprocessor 112 instructs the parity code calculation module 210 to store the values stored in the N registers $G(1)$, $G(2)$, . . . , and $G(N)$ into the buffer $B(1)$, where the values are the parity code $P_2(1)$ corresponding to the partial data $D_2(1)$. Afterward, the parity code calculation module 210 resets the values stored in the N registers $G(1)$, $G(2)$, . . . , and $G(N)$, and receives the partial data $D_2(2)$ in order, and further performs parity code calculations on the partial data $D_2(2)$. In addition, the microprocessor 112 instructs the encoder 114E to switch the multiplexing unit 220, causing the partial data $D_2(2)$ to be input into the Flash memory 120. When the whole of the partial data $D_2(2)$ has been input into the parity code calculation module 210, the microprocessor 112 instructs the parity code calculation module 210 to store the values stored in the N registers $G(1)$, $G(2)$, . . . , and $G(N)$ into the buffer $B(2)$, where the values are the parity code $P_2(2)$ corresponding to the partial data $D_2(2)$. After the partial data $D_1(2)$ and $D_2(2)$ are output from the encoder 114E and calculations of the parity codes $P_2(1)$ and $P_2(2)$ are completed, the microprocessor 112 instructs the encoder 114E to switch the multiplexing unit 220, causing the parity codes $P_2(1)$ and $P_2(2)$ to be output to the Flash memory 120. As a result, the partial data $D_2(1)$ and $D_2(2)$ and the associated parity code $P_2(1)$ and $P_2(2)$ shown in FIG. 3B can be completed. Please note that the microprocessor 112 can directly instruct the associated components/module/units to perform the operations disclosed above, and can also instruct the ECC engine to perform encoding using a specific encoding mode (e.g. any pseudo mode of the first set of pseudo modes $M_{PS}(24, 2)$, $M_{PS}(28, 2)$, . . . , etc.), allowing the ECC engine to directly instruct the associated components/module/units to perform the operations disclosed above in the specific encoding mode in order to reduce the working load of the microprocessor.

Additionally, FIG. 3C illustrates the writing/programming order of the partial data $D_4(1)$, $D_4(2)$, $D_4(3)$, and $D_4(4)$ corresponding to another pseudo mode (e.g. any of the pseudo modes $M_{PS}(24, 4)$, $M_{PS}(28, 4)$, $M_{PS}(36, 4)$, $M_{PS}(40, 4)$, $M_{PS}(48, 4)$, and $M_{PS}(60, 4)$) and the associated parity codes $P_4(1)$, $P_4(2)$, $P_4(3)$, and $P_4(4)$. For brevity, similar descriptions for this embodiment are not repeated in detail here.

Figures 4, 5:
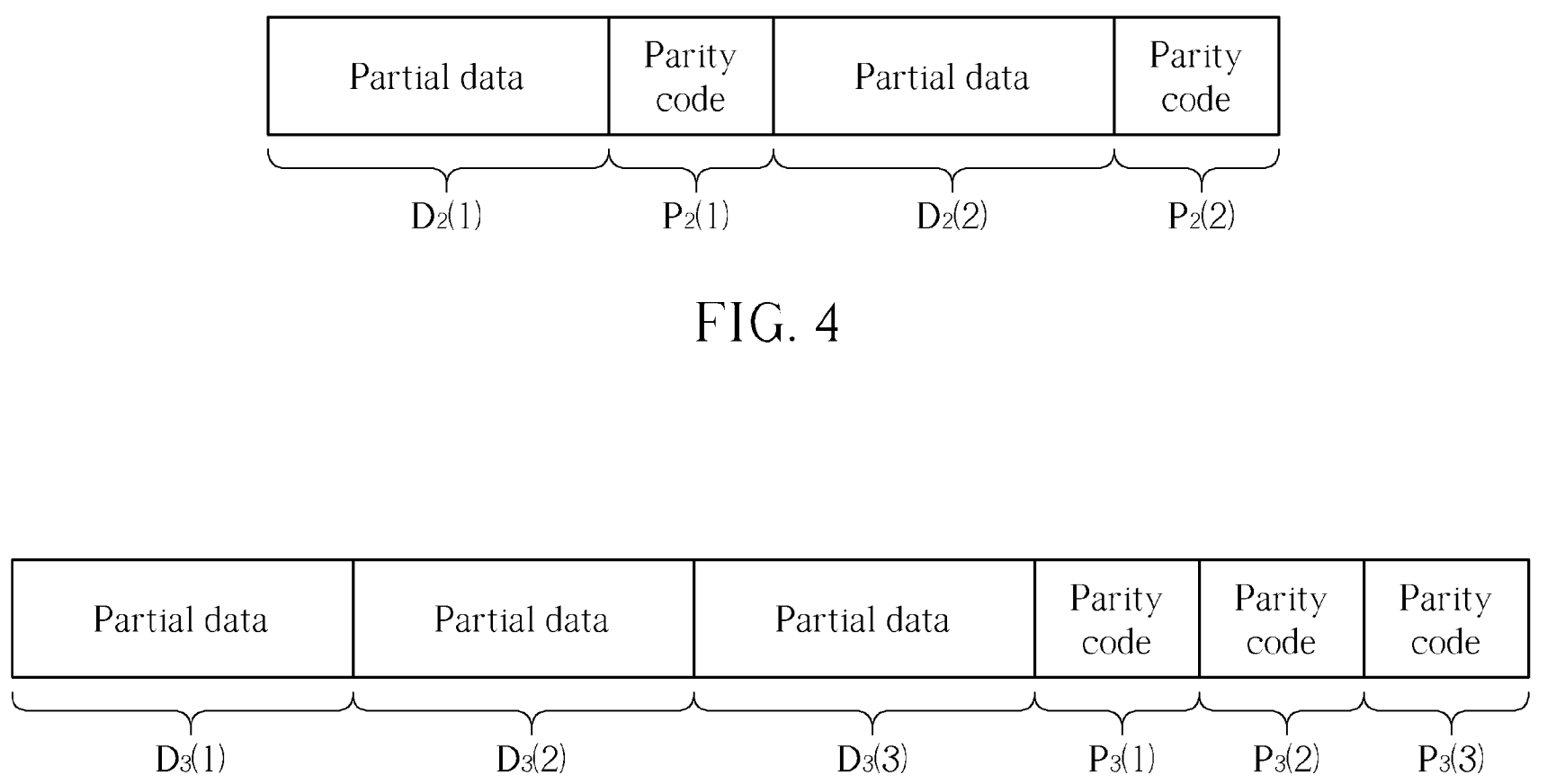

FIG. 4 illustrates some implementation details of the method 910 shown in FIG. 2 according to an embodiment of the present invention, where this embodiment is a variation of the embodiment shown in FIG. 3B. The aforementioned encoder 114E first writes/programs the partial data $D_2(1)$ and the associated parity code $P_2(1)$ into the Flash memory 120, and then writes/programs the partial data $D_2(2)$ and the associated parity code $P_2(2)$ into the Flash memory 120. In addition, the decoder 114D can perform decoding in response to the writing/programming order disclosed above, where the controller of this embodiment can save the storage space for buffering during decoding. Similar descriptions for this embodiment are not repeated in detail here.

FIG. 5 illustrates some implementation details of the method 910 shown in FIG. 2 according to another embodiment of the present invention, where this embodiment is a variation of the embodiment shown in FIG. 3B or FIG. 3C. FIG. 5 illustrates the writing/programming order of the partial data $D_3(1)$, $D_3(2)$, and $D_3(3)$ corresponding to another pseudo mode (e.g. any of the pseudo modes $M_{PS}(24, 3)$, $M_{PS}(28, 3)$, $M_{PS}(36, 3)$, $M_{PS}(40, 3)$, $M_{PS}(48, 3)$, and $M_{PS}(60, 3)$) and the associated parity code $P_3(1)$, $P_3(2)$, and $P_3(3)$. Similar descriptions for this embodiment are not repeated in detail here.

It is an advantage of the present invention that the error correction implemented according to the present invention can properly utilize the remaining storage space mentioned above, and the related art problem of wasting the storage space of the Flash memory is no longer an issue. In contrast to the related art, the present invention can enhance the error correction capability of the controller of the memory device, having no need to increase the basic error correction bit count of the ECC engine or greatly increase the complexity of the ECC engine. Therefore, in a situation where the chip area and the associated costs are not increased, the present invention can achieve the goal of giving consideration to both operation performance and system resource management.

Those skilled in the art will readily observe that numerous modifications and alterations of the device and method may be made while retaining the teachings of the invention.

What is claimed is:

1. A method for enhancing error correction capability, the method being applied to a controller of a memory device, the method being utilized for enhancing the error correction capability of the controller without need to increase a basic error correction bit count, the method comprising:

according to an error correction magnification factor, respectively obtaining a plurality of portions of data, wherein the portions are partial data to be encoded or decoded; and regarding the portions that are the partial data to be encoded or decoded, respectively performing encoding or decoding corresponding to the error correction magnification factor, in order to generate encoded or decoded data corresponding to a predetermined error correction bit count, wherein a ratio of the predetermined error correction bit count to the basic error correction bit count is equal to the error correction magnification factor.

2. The method of claim 1, wherein a number of the portions is equal to the error correction magnification factor.

3. The method of claim 2, wherein in a situation where encoding is performed, the encoded or decoded data is encoded data, and the step of respectively performing encoding or decoding corresponding to the error correction magnification factor in order to generate the encoded or decoded data corresponding to the predetermined error correction bit count further comprises:

regarding the portions, respectively generating a plurality of parity codes, wherein a number of the parity codes is equal to the number of the portions, and the encoded data comprises the portions and the parity codes.

4. The method of claim 3, wherein a bit count of each parity code is equal to the basic error correction bit count.

5. The method of claim 2, wherein in a situation where decoding is performed, the encoded or decoded data is decoded data, and the step of respectively performing encoding or decoding corresponding to the error correction magnification factor in order to generate the encoded or decoded data corresponding to the predetermined error correction bit count further comprises:

regarding the portions, respectively performing error correction according to a plurality of parity codes appended to the portions, wherein a number of the parity codes is equal to the number of the portions.

6. The method of claim 1, wherein data amounts of any two of the portions are equal to each other.

7. The method of claim 1, wherein any two of the portions do not overlap each other.

8. A memory device, error correction capability of the memory device being enhanced without need to increase a basic error correction bit count, the memory device comprising:

a Flash memory, wherein the Flash memory comprises a plurality of blocks; and a controller arranged to access the Flash memory and manage the plurality of blocks, wherein an Error Correction Code (ECC) engine of the controller is implemented by utilizing a microprocessor and/or a control logic within the controller, and according to an error correction magnification factor, the controller respectively obtains a plurality of portions of data, wherein the portions are partial data to be encoded or decoded;

wherein regarding the portions that are the partial data to be encoded or decoded, the ECC engine respectively performs encoding or decoding corresponding to the error correction magnification factor, in order to generate encoded or decoded data corresponding to a predetermined error correction bit count, wherein a ratio of the predetermined error correction bit count to the basic error correction bit count is equal to the error correction magnification factor.

9. The memory device of claim 8, wherein a number of the portions is equal to the error correction magnification factor.

10. The memory device of claim 9, wherein in a situation where encoding is performed, the encoded or decoded data is encoded data, and the ECC engine comprises:

a parity code calculation module, wherein regarding the portions, the parity code calculation module respectively generates a plurality of parity codes, wherein a number of the parity codes is equal to the number of the portions, and the encoded data comprises the portions and the parity codes.

11. The memory device of claim 10, wherein a bit count of each parity code is equal to the basic error correction bit count.

12. The memory device of claim 9, wherein in a situation where decoding is performed, the encoded or decoded data is decoded data, and the ECC engine comprises:

a plurality of syndrome computation units, wherein regarding the portions, the syndrome computation units respectively perform syndrome computation operations of error correction according to a plurality of parity codes appended to the portions, wherein a number of the parity codes is equal to the number of the portions.

13. The memory device of claim 12, wherein in a situation where decoding is performed, the ECC engine further comprises:

a corrector, wherein regarding the portions, the corrector respectively performs error correction according to computation results of the syndrome computation operations.

14. The memory device of claim 8, wherein data amounts of any two of the portions are equal to each other.

15. The memory device of claim 8, wherein any two of the portions do not overlap each other.

16. A controller of a memory device, error correction capability of the controller being enhanced without need to increase a basic error correction bit count, the controller being utilized for accessing a Flash memory of the memory device, the Flash memory comprising a plurality of blocks, the controller comprising:

a read only memory (ROM) arranged to store a program code; and a microprocessor arranged to execute the program code to control the access to the Flash memory and manage the plurality of blocks;

wherein an Error Correction Code (ECC) engine of the controller is implemented by utilizing a control logic within the controller and/or the microprocessor executing the program code, and according to an error correction magnification factor, the controller respectively obtains a plurality of portions of data, wherein the portions are partial data to be encoded or decoded; and regarding the portions that are the partial data to be encoded or decoded, the ECC engine respectively performs encoding or decoding corresponding to the error correction magnification factor, in order to generate encoded or decoded data corresponding to a predetermined error correction bit count, wherein a ratio of the predetermined error correction bit count to the basic error correction bit count is equal to the error correction magnification factor.

17. The controller of claim 16, wherein data amounts of any two of the portions are equal to each other.

18. The controller of claim 16, wherein any two of the portions do not overlap each other.

* * * * *